(12) United States Patent
Wu et al.

(10) Patent No.: US 10,652,524 B2
(45) Date of Patent: May 12, 2020

(54) PARALLAX BARRIER, DISPLAY DEVICE AND MANUFACTURING METHOD THEREOF

(71) Applicant: BOE TECHNOLOGY GROUP CO., LTD., Beijing (CN)

(72) Inventors: Naifu Wu, Beijing (CN); Wei Wei, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/742,714

(22) PCT Filed: Jun. 29, 2017

(86) PCT No.: PCT/CN2017/090764
§ 371 (c)(1),
(2) Date: Jan. 8, 2018

(87) PCT Pub. No.: WO2018/040709
PCT Pub. Date: Mar. 8, 2018

(65) Prior Publication Data
US 2018/0376133 A1 Dec. 27, 2018

(51) Int. Cl.
*H04N 13/31* (2018.01)
*H04N 13/312* (2018.01)
(Continued)

(52) U.S. Cl.
CPC .......... *H04N 13/312* (2018.05); *G02B 30/00* (2020.01); *G02B 30/25* (2020.01); *G02B 30/27* (2020.01);
(Continued)

(58) Field of Classification Search
CPC .. H04N 13/312; G02B 27/22; G02B 27/2214; G02B 22/26; G02F 1/133528;
(Continued)

(56) References Cited

U.S. PATENT DOCUMENTS 6,590,605 B1 * 7/2003 Eichenlaub ............ H04N 13/31
348/51
7,420,637 B2 * 9/2008 Imai .................... G02B 27/2214
349/110
(Continued)

FOREIGN PATENT DOCUMENTS

CN 102566060 A 7/2012
CN 202735996 A 2/2013
(Continued)

OTHER PUBLICATIONS

First Chinese Office action dated Apr. 24, 2017.
(Continued)

*Primary Examiner* — Michael Lee
(74) *Attorney, Agent, or Firm* — Dilworth & Barrese, LLP.; Michael J. Musella, Esq.

(57) ABSTRACT

A parallax barrier, a display device and a manufacturing method thereof are disclosed. The parallax barrier includes a plurality of strip-shaped polarizing portions and a plurality of strip-shaped transparent portions, the plurality of strip-shaped polarizing portions and the plurality of strip-shaped transparent portions extend in the same direction, and the plurality of strip-shaped polarizing portions and the plurality of strip-shaped transparent portions are alternately arranged. With the parallax barrier, naked eye or multi-view display can be achieved by light splitting, and the curing non-uniformity in the curing and bonding process can be alleviate to increase the manufacturing yield.

7 Claims, 5 Drawing Sheets

(51) Int. Cl.
*G02B 30/00* (2020.01)
*G02B 30/25* (2020.01)
*G02B 30/27* (2020.01)
*G02F 1/1335* (2006.01)
*G02F 1/1347* (2006.01)
*H01L 27/32* (2006.01)

(52) U.S. Cl.
CPC ...... *G02F 1/1347* (2013.01); *G02F 1/133528* (2013.01); *H01L 27/3232* (2013.01); *H04N 13/31* (2018.05); *G02F 2001/133538* (2013.01); *G02F 2001/133541* (2013.01)

(58) Field of Classification Search
CPC ....... G02F 1/1347; G02F 2001/133541; H01L 27/3232
USPC .......................................................... 348/58
See application file for complete search history.

(56) References Cited

U.S. PATENT DOCUMENTS

| | | | | |
|---|---|---|---|---|
| 8,064,000 | B2* | 11/2011 | Lee | G02B 27/2214 349/15 |
| 2007/0013624 | A1* | 1/2007 | Bourhill | B82Y 20/00 345/84 |
| 2010/0277657 | A1* | 11/2010 | Fukushima | G02B 27/2214 349/15 |
| 2012/0170115 | A1 | 7/2012 | Zhang et al. | |
| 2013/0201427 | A1* | 8/2013 | Chen | G02B 27/2214 349/65 |
| 2013/0293793 | A1* | 11/2013 | Lu | G02B 27/2214 349/15 |
| 2014/0035800 | A1* | 2/2014 | Lee | H04N 13/315 345/96 |
| 2015/0152299 | A1* | 6/2015 | Saito | C09J 4/00 428/522 |
| 2016/0274370 | A1* | 9/2016 | Wu | G02B 27/26 |

FOREIGN PATENT DOCUMENTS

| | | |
|---|---|---|
| CN | 103135239 A | 6/2013 |
| CN | 105182554 A | 12/2015 |
| CN | 106291957 A | 1/2017 |
| EP | 0829744 A2 | 12/1997 |
| WO | 0235277 A1 | 5/2002 |

OTHER PUBLICATIONS

Second Chinese Office Action dated Aug. 7, 2017.
Search Report dated Feb. 16, 2017.
International Search Report dated Sep. 28, 2017.

* cited by examiner

PARALLAX BARRIER, DISPLAY DEVICE AND MANUFACTURING METHOD THEREOF

TECHNICAL FIELD

The embodiments of the present disclosure relate to a parallax barrier, a display device, and a manufacturing method thereof.

BACKGROUND

Parallax barrier technology is a kind of naked-eye 3D technology. Its principle is to use strips of light transmitting and light shielding alternatively disposed as a parallax barrier so that an opaque barrier blocks light to the right eye when an image that is desired to be seen by the left eye is displayed on the display screen. Similarly, when an image that is desired to be seen by the right eye is displayed on the display screen, the opaque strips block light to the left eye, and 3D display effect is achieved by separating the visual image seen by the left eye and the right eye, and reconstructing image information by the brain to form a three-dimensional image.

SUMMARY

The embodiments of the present disclosure provide a parallax barrier, a display device and a manufacturing method thereof. With the parallax barrier, naked eye or multi-view display can be achieved by light splitting, and curing non-uniformity in a curing and bonding process can also be improved to improve the manufacturing yield.

At least one embodiment of the present disclosure provide a parallax barrier comprising a plurality of strip-shaped polarizing portions and a plurality of strip-shaped transparent portions, wherein the plurality of strip-shaped polarizing portions and the plurality of strip-shaped transparent portions extend in a same direction, and the plurality of strip-shaped polarizing portions and the plurality of strip-shaped transparent portions are alternately arranged.

In one embodiment of the present disclosure, for example, the strip-shaped polarizing portions are linear polarizing portions or circular polarizing portions.

In one embodiment of the present disclosure, for example, the strip-shaped polarizing portions and the strip-shaped transparent portions are provided in a same layer.

In one embodiment of the present disclosure, for example, the parallax barrier further comprises a transparent substrate, wherein the strip-shaped polarizing portions are disposed on the transparent substrate at intervals and portions of the transparent substrate between every two adjacent strip-shaped polarizing portions are the strip-shaped transparent portions.

In one embodiment of the present disclosure, for example, the parallax barrier further comprises a polarizer, wherein the polarizer is disposed on the strip-shaped polarizing portions, and a polarization direction of the polarizer and a polarization direction of the strip-shaped polarizing portions are perpendicular to each other or have opposite rotation directions.

At least one embodiment of the present disclosure provides a display device comprising a display panel and a parallax barrier, wherein the parallax barrier is any one of the parallax barriers as mentioned above.

In one embodiment of the present disclosure, for example, the display panel is a liquid crystal display panel, and the parallax barrier is disposed on a light-exiting side of the liquid crystal display panel.

In one embodiment of the present disclosure, for example, the display panel is a liquid crystal display panel, the display device further comprises a backlight module located on a light incident side of the display panel, and the parallax barrier is disposed between the liquid crystal display panel and the backlight module.

In one embodiment of the present disclosure, for example, the display panel comprises a first polarizer disposed on a side of the display panel close to the parallax barrier and a second polarizer disposed on a side of the display panel away from the parallax barrier, a polarization direction of the strip-shaped polarizing portions of the parallax barrier and a polarization direction of the first polarizer are perpendicular to each other or have opposite ration directions.

In one embodiment of the present disclosure, for example, the strip-shaped polarizing portions are linear polarizing portions, the first polarizer is a linear polarizer, and a transmission axis direction of the strip-shaped polarizing portions is perpendicular to a transmission axis direction of the first polarizer.

In one embodiment of the present disclosure, for example, the strip-shaped polarizing portions are circular polarizing portions, the first polarizer is a circular polarizer, and a rotation direction of the polarization direction of the strip-shaped polarizing portions are opposite to a rotation direction of polarization direction of the first polarizer.

In one embodiment of the present disclosure, for example, the display panel is an organic light-emitting display panel, the parallax barrier is disposed on a light-exiting side of the display panel, and the display device further comprises: a third polarizer disposed on a side of the parallax barrier close to the display panel or on a side away from the display panel, and a polarization direction of the strip-shaped polarizing portions of the parallax barrier and a polarization direction of the first polarizer are perpendicular to each other or have opposite rotation directions.

In one embodiment of the present disclosure, for example, the strip-shaped polarizing portions are linear polarizing portions, the third polarizer is a linear polarizer, and a transmission axis direction of the strip-shaped polarizing portions is perpendicular to a transmission axis direction of the third polarizer.

In one embodiment of the present disclosure, for example, the strip-shaped polarizing portions are circular polarizing portions, the third polarizer is a circular polarizer, and a rotation direction of the polarization direction of the strip-shaped polarizing portions is opposite to a rotation direction of polarization direction of the third polarizer.

In one embodiment of the present disclosure, for example, the display panel comprises a plurality of pixel units, and the parallax barrier is configured to transmit light emitted by the pixel units for a left-eye image to a left eye of a user and transmit light emitted by the pixel units for a right-eye image to a right eye of the user.

At least one embodiment of the present disclosure provide a manufacturing method of a display device, comprising: applying liquid photo-curable adhesive on a display panel; attaching any one of the parallax barriers as mentioned above to the liquid photo-curable adhesive; and irradiating the parallax barrier with curing light to cure the liquid photo-curable adhesive.

In one embodiment of the present disclosure, for example, the curing light is polarized light and a polarization direction of the curing light is a same with a polarization direction of the strip-shaped polarizing portions of the parallax barrier.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the invention.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present invention, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
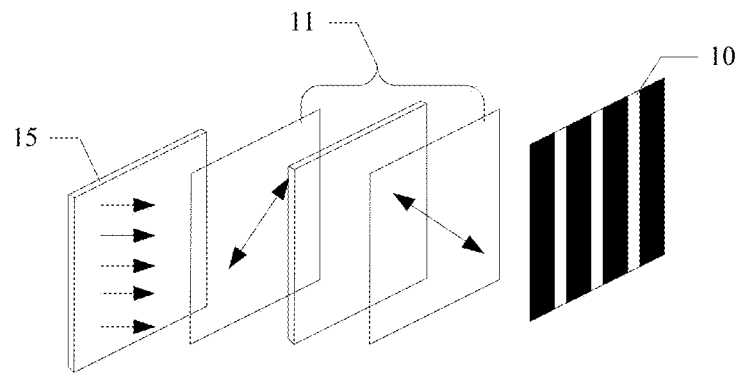
FIG. 1a is a schematic view of a display device.

A display device is illustrated in FIG. 1a. The display device includes a parallax barrier 10, a liquid crystal display panel 11 and a backlight module 15. Currently, the parallax barrier 10 usually uses an opaque black and white parallax barrier or a film for light splitting. For example, during operation of the display device, light source for displaying is provided by the backlight module 15, light emitted by which enters the liquid crystal display panel 11, parallax images are displayed by the liquid crystal display panel 11 through pixel units and then projected to a predetermined direction by the parallax barrier 10. Black barrier part of the parallax barrier 10 is opaque, and the white barrier part is normally light transmitted. The black barrier part blocks light to the left (right) eye so that the pixels seen by the left and right eyes are not the same.

Figure 1B:
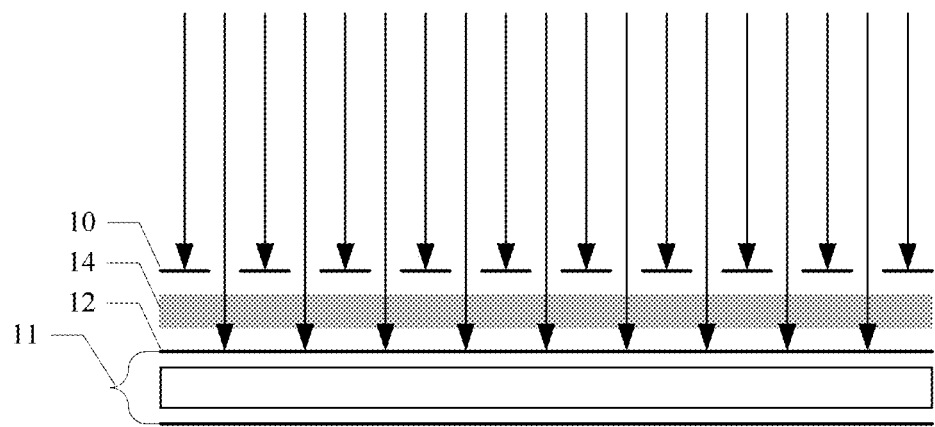
FIG. 1b is a schematic view of a manufacturing method of a display device.

A manufacturing method of a display device is illustrated in FIG. 1b. In manufacturing process, a liquid ultraviolet (UV) curable adhesive 14 needs to be cured to attach the parallax barrier 10 to the liquid crystal display panel 11. However, because a black barrier part of the parallax barrier 14 cannot transmit UV-curable light, the curing effect is not good, problems such as uneven curing or visual defects occur and the viewer may feel uncomfortable with the visual sense. Therefore, the present disclosure provides a parallax barrier having strip-shaped polarizing characteristic, which can not only achieve the function of light splitting but also improve the curing non-uniformity of the liquid photo-curable adhesive in a process of curing and bonding the parallax barrier so as to improve the production yield.

Figure 2A:
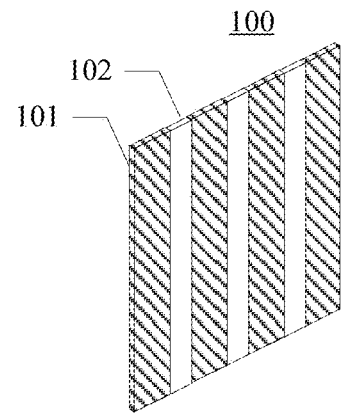
FIG. 2a is a schematic structural view of a parallax barrier according to an embodiment of the present disclosure.
Figure 2B:
FIG. 2b is a structural side view of a parallax barrier according to an embodiment of the present disclosure.

At least one embodiment of the present disclosure provides a parallax barrier including a plurality of strip-shaped polarizing portions and a plurality of strip-shaped transparent portions, the plurality of strip-shaped polarizing portions and the plurality of strip-shaped transparent portions extend in the same direction, the plurality of strip-shaped polarizing portions and the plurality of strip-shaped transparent portions are alternately arranged. FIG. 2a and FIG. 2b illustrate a parallax barrier according to an embodiment of the present disclosure, and FIG. 2b is a side view of the parallax barrier according to an embodiment of the present disclosure. The parallax barrier 100 includes a plurality of strip-shaped polarizing portions 101 and a plurality of strip-shaped transparent portions 102. The plurality of strip-shaped polarizing portions 101 are arranged at equal intervals and are alternately arranged with the strip-shaped transparent portions 102. For example, the strip-shaped polarizing portions 101 and the strip-shaped transparent portions 102 can be disposed in the same layer, so that thickness of the parallax barrier 100 can be reduced. The strip-shaped polarizing portions 101 and the strip-shaped transparent portions 102 can be disposed on a transparent film or glass by printing alternately or photo-lithographing for forming the strip-shaped polarizing portions 101.

For example, a width of each of the strip-shaped polarizing portions 101 is wider than that of each of the strip-shaped transparent portions 102, and the width ratio can be 3~4:1.

For example, the strip-shaped polarizing portions 101 and the strip-shaped transparent portions 102 can also be at an angle of 10°~15° with respect to a vertical direction (for example, in a normal viewing state, the vertical direction is a direction parallel with a direction perpendicular to a connection line of human eyes), thereby avoiding appearance of interference ripples.

In the parallax barrier according to this embodiment, in a case that the parallax barrier 100 is irradiated with light having the same polarization direction as the strip-shaped polarizing portions 101, the strip-shaped polarizing portions 101 don't block the light, and the strip-shaped polarizing portions 101 and the strip-shaped transparent portions 102 have almost the same light transmitting effect. In a case that the parallax barrier 100 is irradiated with light having a polarization direction perpendicular to the polarization direction of the strip-shaped portions 101 or having a rotation direction opposite to that of a polarization direction of the strip-shaped portions 101, the strip-shaped portions 101 blocks the light and corresponds to the black barrier part of a conventional parallax barrier, and the strip-shaped transparent portions 102 don't block the light, thereby achieving light splitting effect. The rotation direction of the polarization direction of the strip-shaped polarizing portions herein mainly refers to circular polarizing portions, and subsequent description about this also takes circular polarizing portions as an example.

Figure 3A:
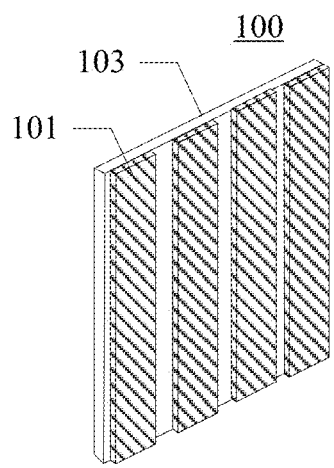
FIG. 3a is a schematic view of a parallax barrier according to another embodiment of the present disclosure.
Figure 3B:
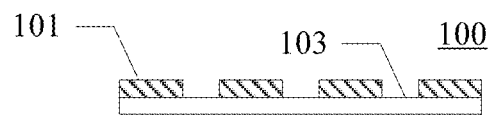
FIG. 3b is a structural side view of a parallax barrier structure according to another embodiment of the present disclosure.

FIG. 3a and FIG. 3b are schematic structural diagrams of a parallax barrier according to another embodiment of the present disclosure, and FIG. 3b is a side view of a parallax barrier according to another embodiment of the present disclosure. As illustrated in FIGS. 3a and 3b, the parallax barrier 100 further includes a transparent substrate 103. The strip-shaped polarizing portions 101 are disposed on the transparent substrate 103 at intervals. Gaps between adjacent strip-shaped polarizing portions 101 form the strip-shaped transparent portions. That is, a region of the transparent substrate 103 where the strip-shaped polarizing portions 101 are not disposed forms the plurality of transparent strip-shaped portions. The manufacturing process of the parallax barrier provided in this embodiment is relatively simple.

For example, each of the strip-shaped polarizing portions 101 has a wider width than each of the strip-shaped transparent portions, and a width ratio can be 3~4:1. For example, the strip-shaped polarizing portions 101 can be at an angle of 10°~15° with respect to a vertical direction (for example, in a normal viewing state, the vertical direction is a direction parallel with a direction perpendicular to a connection line of human eyes), so as to better avoid appearance of interference ripples. The transparent substrate 103 is selected to be as thin as possible so that the overall thickness of the parallax barrier 100 can be made as thin as possible.

In a case that the parallax barrier 100 is irradiated with light having the same polarization direction as the strip-shaped polarizing portions 101, the strip-shaped polarizing portions 101 don't block the light, and the light transmission effect of the strip-shaped polarizing portions 101 and the strip-shaped transparent portions are almost the same. In a case that the parallax barrier 100 is irradiated with light having a polarization direction perpendicular to the polarization direction of the strip-shaped polarizing portions 101 or having a rotation direction opposite to the rotation direction of the polarization direction of the strip-shaped polarizing portions 101, the strip-shaped polarizing portions 101 blocks the light and corresponds to a black barrier part of a conventional parallax barrier, and the strip-shaped transparent portions don't block the light, thereby achieving the role of light splitting.

Figure 4:
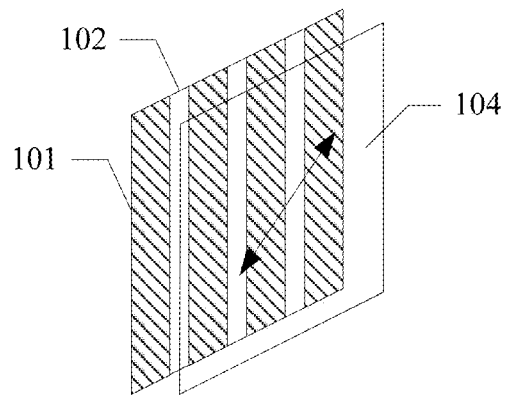
FIG. 4 is a structural schematic view of a parallax barrier according to an embodiment of the present disclosure.

FIG. 4 is a schematic structural view of a parallax barrier according to another embodiment of the present disclosure.

The parallax barrier 100 further includes a polarizer 104 disposed on the strip-shaped polarizing portions 101 and having a polarization direction perpendicular to the polarization direction of the strip-shaped polarizing portions 101 (in the case of linear polarization) or having a rotation direction opposite to the rotation direction of the polarization direction of the strip-shaped polarizing portions 101 (in the case of circular polarization). The strip-shaped polarizing portions 101 and the strip-shaped transparent portions 102 herein can be provided in the same layer or in different layers. As illustrated in FIG. 4, the polarizer 104 is a linear polarizer, and a transmission axis direction of the polarizer 104 and a transmission axis direction of the strip-shaped polarizing portions 101 are perpendicular to each other. In a case that the polarizer 104 is located on a light incident side of the strip-shaped polarizing portions 101, light passing through the polarizer 104 becomes linearly polarized light having the same polarization direction as the polarizer 104 and perpendicular to the polarization direction of the strip-shaped polarizing portions 101, and thus cannot be transmitted through the strip-shaped polarizing portions 101. Because the strip-shaped transparent portions 102 don't have the polarization characteristic, the linearly polarized light can be transmitted through the strip-shaped transparent portions 102. Therefore, the strip-shaped polarizing portions 101 and the strip-shaped transparent portions 102 achieve the role of light splitting. In a case that the polarizer 104 is located on a light-exiting side of the strip-shaped polarizing portions 101, light passing through the strip-shaped polarizing portions 101 becomes linearly polarized light having the same polarization direction as the strip-shaped polarizing portions 101. However, light passing through the strip-shaped transparent portions 102 don't change. Because a transmission axis direction of the light passing through the strip-shaped polarizing portions 101 are perpendicular to a transmission axis direction of the polarizer 104, the linearly polarized light transmitted through the strip-shaped polarizing portions 101 cannot pass through the polarizer 104. However, the light passing through the strip-shaped transparent portions 102 can pass through the polarizer 104, thereby achieving the role of light splitting.

Figure 5:
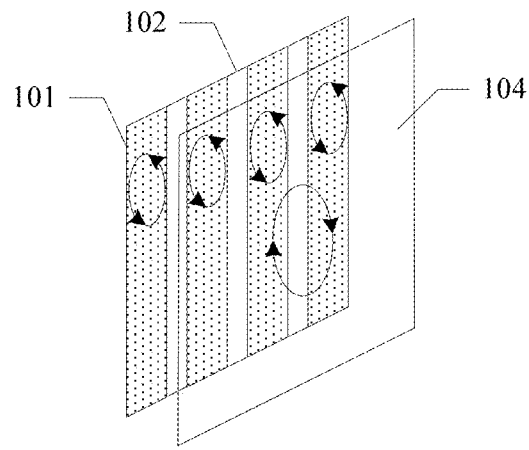
FIG. 5 is a structural schematic view of a parallax barrier according to an embodiment of the present disclosure.

FIG. 5 is a schematic structural view of a parallax barrier according to another embodiment of the present disclosure. The parallax barrier 100 further includes a polarizer 104 disposed on the strip-shaped polarizing portions 101. The polarizer 104 has a polarization direction perpendicular to the polarization direction of the strip-shaped polarizing portions 101 or has a rotation direction opposite to the rotation direction of the polarization direction of the strip-shaped polarizing portions 101. The strip-shaped polarizing portions 101 and the strip-shaped transparent portions 102 herein can be provided in the same layer or in different layers. As illustrated in FIG. 5, the polarizer 104 is a circular polarizer, and a rotation direction of the polarization direction of the polarizer 104 is opposite to a rotation direction of the polarization direction of the strip-shaped portions 101. In a case that the polarizer 104 is disposed on a light incident side of the strip-shaped polarizing portions 101, light passing through the polarizer 104 becomes circularly polarized light with the same rotation direction as the polarization direction of the polarizer 104. Because the circularly polarized light has a rotation direction opposite to the rotation direction of the strip-shaped polarizing portions 101, it cannot be transmitted through the strip-shaped polarizing portions 101. Because the strip-shaped transparent portions 102 don't have polarization characteristic, the circularly polarized light can be transmitted through the strip-shaped transparent portions 102. Therefore, the strip-shaped polarizing portions 101 and the strip-shaped transparent portions 102 achieve the role of light splitting. In a case that the polarizer 104 is located on a light-exiting side of the strip-shaped polarizing portions 101, light passes through the strip-shaped polarizing portions 101 and becomes circularly polarized light having the same rotation direction with the polarization direction of the strip-shaped polarizing portions 101, and light passes through the strip-shaped transparent portions 102 has no change. Because the rotation direction of the light passing through the strip-shaped polarizing portions 101 are opposite to the rotation direction of the polarizer 104, the light cannot be transmitted through the polarizer 104, light passing through the strip-shaped transparent portions 102 can pass through the polarizer 104, thereby achieving light splitting effect.

Figure 6:
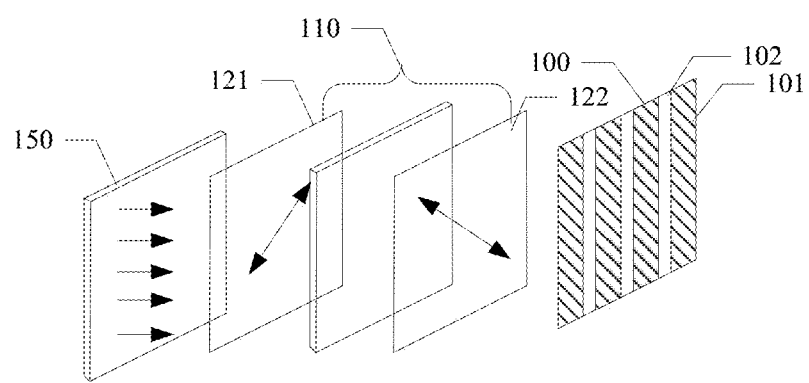
FIG. 6 is a schematic view of a display device according to an embodiment of the present disclosure.

FIG. 6 is a schematic view of a display device according to an embodiment of the present disclosure. The display device includes a display panel 110 and a parallax barrier 100. The parallax barrier 100 herein is the parallax barrier 100 as illustrated in FIGS. 2*a*-3*b*. As illustrated in FIG. 6, the display panel 110 is a liquid crystal display panel. The display device further includes a backlight module 150 located on a light incident side of the liquid crystal display panel 110. During operation of the display device, the backlight module 150 provides a light source for display, light emitted by which enters the liquid crystal display panel 110, parallax images are displayed through pixel units of the liquid crystal display panel 110, and then projected to a predetermined direction by the parallax barrier 100.

The liquid crystal display panel 110 includes a first polarizer 121 disposed on a side of the liquid crystal display panel 110 close to the parallax barrier 100 and a second polarizer 122 disposed on a side of the liquid crystal display panel 110 away from the parallax barrier 100. The strip-shaped polarizing portions 101 of the parallax barrier 100 has a polarization direction perpendicular to that of the first polarizer 121 or has a rotation direction opposite to that of the polarization direction of the first polarizer 121.

For example, the strip-shaped polarizing portions 101 are linear polarizing portions, the first polarizer 121 is a linear polarizer, and a transmission axis direction of the first polarizer 121 close to the parallax barrier 100 is perpendicular to a transmission axis direction of the strip-shaped polarizing portions 101. Light passing through the first polarizer 121 becomes linearly polarized light having the same polarization direction with the first polarizer 121. The linearly polarized light has a polarization direction perpendicular to that of the strip-shaped polarizing portions 101, and therefore cannot pass through the strip-shaped polarizing portions 101. Because the strip-shaped transparent portions 102 don't have polarization characteristic, the linearly polarized light can be transmitted through the strip-shaped transparent portions 102. Therefore, the strip-shaped polarizing portions 101 and the strip-shaped transparent portions 102 achieve the role of light splitting.

For example, the strip-shaped polarizing portions 101 are circular polarizing portions, the first polarizer 121 is a circular polarizer, and a rotation direction of the polarization direction of the first polarizer 121 close to the parallax barrier 100 is opposite to that of the polarization direction of the strip-shaped polarizing portions. Light passing through the first polarizer 121 becomes circularly polarized light with the same rotation direction as the polarization direction of the first polarizer 121, and the circularly polarized light has a rotation direction of the polarization direction opposite to that of the polarization direction of the strip-shaped polarizing portions 101, and thus cannot be transmitted through the strip-shaped polarizing portions 101. Because the strip-shaped transparent portions 102 don't have polarization characteristic, the circularly polarized light can be transmitted through the strip-shaped transparent portions 102. Therefore, the strip-shaped polarizing portions 101 and the strip-shaped transparent portions 102 achieve the role of light splitting.

Figure 7:
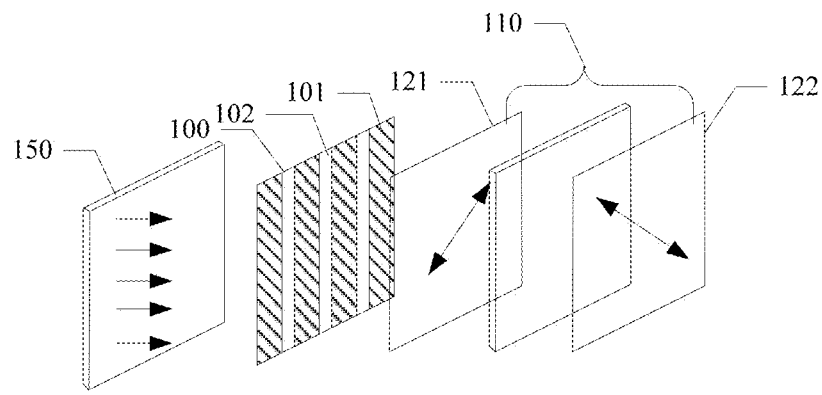
FIG. 7 is a schematic view of a display device according to another embodiment of the present disclosure.

Another embodiment of the present disclosure provides a display device. FIG. 7 is a schematic view of a display device according to another embodiment of the present disclosure. The display device of this embodiment differs from the embodiment as illustrated in FIG. 6 in the following. The parallax barrier 100 is disposed between the liquid crystal display panel 110 and the backlight module 150. During operation of the display device, the backlight module 150 provides light source for display, light emitted by which passes through the strip-shaped polarizing portions 101 of the parallax barrier 100 and becomes polarized light with the same polarization direction as the strip-shaped portions 101. Light passing through the strip-shaped transparent portions 102 does not change. The first polarizer 121 close to the parallax barrier 100 has a polarization direction perpendicular to the polarization direction of the strip-shaped portions 101 or has a rotation direction opposite to the rotation direction of the polarization direction of the strip-shaped portions 101, so that polarized light formed by passing through the strip-shaped portions 101 cannot pass through the first polarizer 121. Therefore, before the light passes through the liquid crystal display panel 110, the parallax barrier 100 has already achieved the role of light splitting.

Figure 8:
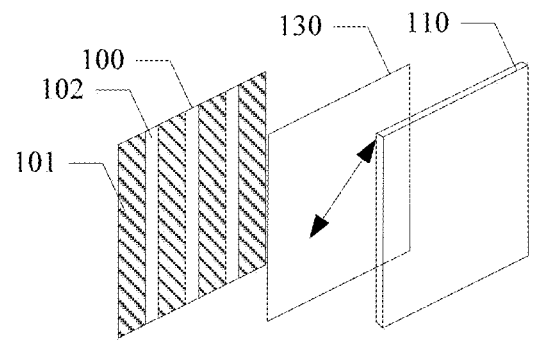
FIG. 8 is a schematic view of a display device according to a further embodiment of the present disclosure.

FIG. 8 illustrates a display device according to still another embodiment of the present disclosure. The display panel 110 in this embodiment is an organic light-emitting display panel. The parallax barrier 100 is disposed on a light-exiting side of the organic light-emitting display panel 110. The display device further includes a third polarizer 130 disposed on a side of the parallax barrier 100 close to the organic light-emitting display panel 110 or a side of the parallax barrier 100 away from the organic light-emitting display panel 110. And the strip-shaped polarizing portions 101 have a polarization direction perpendicular to the first polarizer 121 or a rotation direction opposite to that of the polarization direction of the third polarizer 130.

For example, as illustrated in FIG. 8, the third polarizer 130 is disposed on a side of the parallax barrier 100 close to the organic light-emitting display panel 110, and the strip-shaped polarizing portions 101 are linear polarizing portions. The third polarizer 130 is a linear polarizer. A transmission axis direction of the third polarizer 130 and a transmission axis direction of the strip-shaped portions 101 are perpendicular to each other, and light passing through the third polarizer 130 becomes linearly polarized light having the same polarization direction as the third polarizer 130. The linearly polarized light has a polarization direction perpendicular to that of the strip-shaped portions 101, so that it cannot be transmitted through the strip-shaped polarizing portions 101. Because the strip-shaped transparent portions 102 don't have polarization characteristic, the linearly polarized light can be transmitted through the strip-shaped transparent portions 102. Therefore, the strip-shaped polarizing portions 101 and the strip-shaped transparent portions 102 achieve the role of light splitting.

For example, the strip-shaped polarizing portions 101 are circular polarizing portions, the third polarizer 130 is a circular polarizer, and light passing through the third polarizer 130 becomes circularly polarized light having the same rotation direction of polarization direction as that of the third polarizer 130. The circularly polarized light has a rotation direction of polarization direction opposite to the strip-shaped polarizing portions 101, so that it cannot be transmitted through the strip-shaped polarizing portions 101. Because the strip-shaped transparent portions 102 don't have polarization characteristic, the circularly polarized light can be transmitted through the strip-shaped transparent portions 102. Therefore, the strip-shaped polarizing portions 101 and the strip-shaped transparent portions 102 achieve the role of light splitting.

For example, the third polarizer 130 can be disposed on a side of the parallax barrier 100 away from the organic light-emitting display panel 110, and the strip-shaped polarizing portions 101 and the strip-shaped transparent portions 102 can also achieve the role of light splitting.

For example, the display panel 110 can also be a plasma display panel or an electronic paper.

Figure 9:
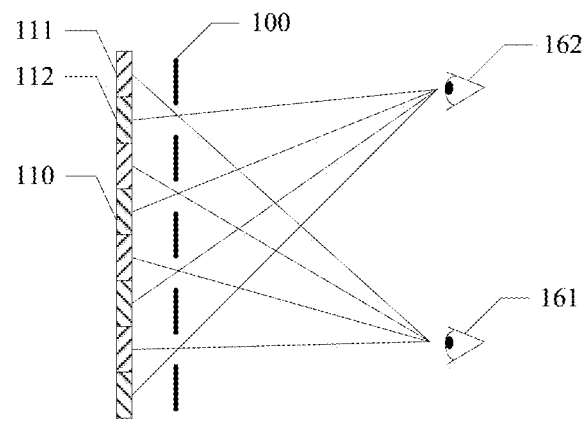
FIG. 9 is a schematic view of 3D display principle according to an embodiment of the present disclosure.

FIG. 9 is a schematic view of 3D display principle according to an embodiment of the present disclosure. The display panel of this embodiment includes a plurality of pixel units. The parallax barrier is configured to transmit light emitted by the pixel units for left eye image toward left eye of a user and transmit light emitted by the pixel units for right eye image toward right eye of the user. As illustrated in FIG. 9, the display panel 110 includes pixel units 111 and 112 for displaying two parallax images. In a case that the backlight emits light to the display panel 110, different parallax images are displayed through the pixel unit 111 and the pixel unit 112 and then projected to a predetermined direction by the parallax barrier 100, and a left viewpoint 161 and a right viewpoint 162 are formed at an optimal viewing distance. In a case that the observer's left eye is located at the left viewpoint 161 and the right eye is located at the right viewpoint 162, a parallax image displayed by the pixel unit 111 corresponding to the left viewpoint 161 and a parallax image displayed by the pixel unit 112 corresponding to the right viewpoint 162 can be observed, and a stereoscopic image is generated based on two types of parallax images. In a case that there are more than two pixel units in the display panel, more than two parallax images can be generated, and different 3D image display can be achieved through different parallax combinations. For example, one column in the pixel units can correspond to one or more strip-shaped transparent portions, the number of the strip-shaped transparent portions in the parallax barrier 100 can be greater than or equal to the total number of the pixel units. For example, a total width of the strip-shaped transparent portions and the strip-shaped polarizing portions in the parallax barrier 100 is less than a width of two columns of pixel units.

Figure 10:
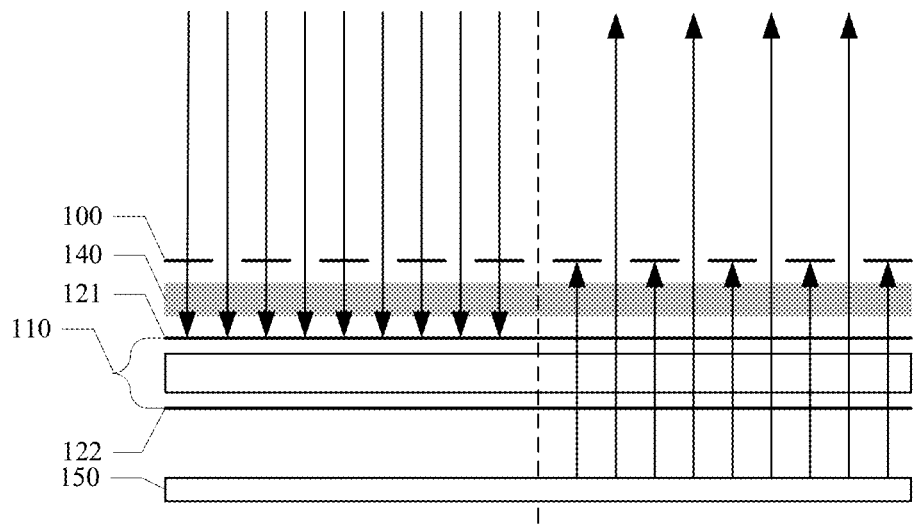
FIG. 10 is a schematic view of a manufacturing method of a display device according to an embodiment of the present disclosure.

Another embodiment of the present disclosure further provides a manufacturing method of the above display device. As illustrated in FIG. 10, the method includes: applying a liquid photo-curable adhesive 140 on a display panel 110; attaching the parallax barrier 100 as illustrated in FIGS. 2a-3b on the liquid photo-curable adhesive 140, irradiating the parallax barrier with curing light to cure the liquid photo-curable adhesive 140. It is to be noted that, the left side of the dotted line in FIG. 10 illustrates a case where the parallax barrier is irradiated with the curing light to cure the liquid photo-curable adhesive, and the right side of the dotted line in FIG. 10 indicates normal display of the display device. Therefore, the manufacturing method of the display device can alleviate non-uniformity curing of the liquid photo-curable adhesive in the process of curing and bonding the parallax barrier, thereby improving the manufacturing yield.

For example, the curing light can be polarized light, and has a polarization direction the same as the strip-shaped polarizing portions of the parallax barrier. As a result, light transmitted through the parallax barrier has the same intensity in a region corresponding to the strip-shaped polarizing portions and in a region corresponding to the strip-shaped transparent portions, so as to further alleviate non-uniformity curing of the liquid photo-curable adhesive in the process of curing and bonding the parallax barrier, thereby increasing production yield.

For example, the liquid photo-curable adhesive 140 can be a UV liquid photo-curable adhesive, and the curing light uses UV curing light. As illustrated in FIG. 10, the display panel 110 is a liquid crystal display panel. First, a liquid UV curable adhesive 140 is applied on the first polarizer 121. Then, the parallax barrier 100 as illustrated in FIG. 2a to FIG. 3b is attached on the liquid UV curable adhesive 140.

Figure 11:
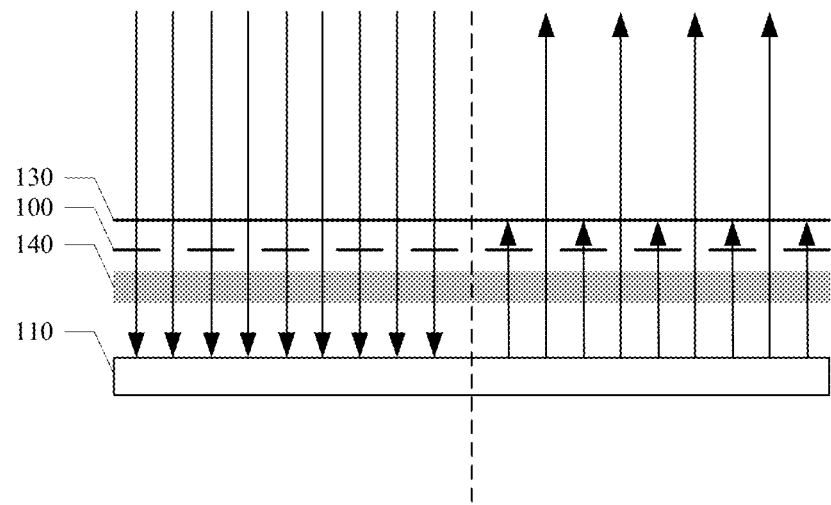
FIG. 11 is a schematic view of a manufacturing method of a display device according to an embodiment of the present disclosure.

FIG. 11 illustrates a manufacturing method of a display device according to an embodiment of the present invention. As illustrated in FIG. 11, the display panel 110 is an organic light-emitting display panel. In a case that the third polarizer 130 is disposed on a side of the parallax barrier 100 away from the organic light-emitting display panel 100, a liquid UV curable adhesive 140 is applied on the organic light-emitting display panel 110, and a parallax barrier 100 is attached to the UV curable adhesive 140. During bonding, the liquid UV curable adhesive 140 needs to be irradiated and cured. In this case, the UV curing light having the same polarization direction as the strip-shaped polarizing portion of the parallax barrier 100 is irradiated from the front face, so that the UV curing light can pass through the strip-shaped polarizing portions in the uppermost layer, and irradiates to the liquid UV curable adhesive 140 uniformly, so as to achieve uniform curing. Then, a liquid UV curable adhesive 140 is coated to the parallax barrier 100, and a third polarizer 130 is attached to the UV curable adhesive 140. In this case, UV curing light having a polarization direction the same as the third polarizer 130 is selected to be irradiated from the front face to achieve uniform curing. It is to be noted that, left side of a dotted line in FIG. 11 illustrates a case where the parallax barrier is irradiated with the curing light to cure the liquid photo-curable adhesive, and right side of the dotted line in FIG. 11 indicates normal display of the display device.

For example, in a case that the third polarizer 130 is disposed on a side of the parallax barrier 100 close to the organic light-emitting display panel 110, a liquid UV curable adhesive 140 is applied on the organic light-emitting display panel 110, and then the third polarizer 130 is attached to the liquid UV curable adhesive 140. In this case, UV curing light having a polarization direction the same as the third polarizer 130 is selected to be irradiated from the front face. Then, a liquid UV curable adhesive 140 is applied on the third polarizer 130, and a parallax barrier 100 is attached to the UV curable adhesive 140. During bonding process, the UV curing light having the same polarization direction as the strip-shaped polarizing portions of the parallax barrier 100 is irradiated from the front face, and the UV curing light can pass through the strip-shaped polarization portions in the uppermost layer so as to be evenly irradiated on the liquid UV curable adhesive 140, so as to achieve uniformity curing.

For example, in a case that the strip-shaped polarizing portions and the strip-shaped transparent portions in the parallax barrier 100 are disposed on the same layer, they are directly attached to the liquid UV curable adhesive 140.

For example, the parallax barrier 100 further includes a transparent substrate. In a case that the strip-shaped polarizing portions are spaced apart from each other on the transparent substrate and the portions of the transparent substrate between every two adjacent strip-shaped polarizing portions are the strip-shaped transparent portions, the transparent substrate is attached to the liquid UV curable adhesive 140 to prevent unevenly distribution of the UV curable adhesive 140.

For example, the parallax barrier 100 and the display panel 110 can also be aligned and bonded by a high-definition camera during bonding process. Before aligning, the parallax barrier 100 and the display panel 110 need to be provided with alignment points at corresponding positions so as to achieve more accurate attachment.

In the display device manufactured by the above manufacturing process, the strip-shaped polarizing portions of the parallax barrier has a polarization direction perpendicular to that of the polarizer close to the strip-shaped polarizing portions or has a rotation direction opposite to the rotation direction of the polarization direction of the polarizer, the strip-shaped polarizing portions play a role of black parallax barrier, light splitting effect can be achieved.

The display device provided by the embodiments of the present disclosure can be widely applied to various display terminals, including but not limited to a mobile phone, a notebook, a tablet computer, an advertisement display board, a digital photo frame, a POS machine, a game terminal and the like.

The foregoing descriptions are merely exemplary embodiments of the present disclosure, but are not intended to limit the protection scope of the present invention. The protection scope of the present invention is determined by the appended claims.

The application claims priority to the Chinese patent application No. 201610772820.1, filed Aug. 30, 2016, the entire disclosure of which is incorporated herein by reference as part of the present application.

The invention claimed is:

1. A display device comprising a display panel, a parallax barrier and a backlight module, wherein,
   the display panel is a liquid crystal display (LCD) panel, the backlight module is located at a light incident side of the LCD panel, and the parallax barrier is located between the LCD panel and the backlight module,
   the LCD panel comprises a first polarizer located of the LCD panel close to the parallax barrier and a second polarizer located at a side of the LCD panel away from the parallax barrier; the first polarizer and the second polarizer located at two sides of the LCD panel, respectively, and both are located at a side of the parallax barrier away from the backlight module, and
   the parallax barrier comprises: a plurality of strip-shaped polarizing portions and a plurality of strip-shaped transparent portions, the plurality of strip-shaped polarizing portions and the plurality of strip-shaped transparent portions extend in a same direction, and the plurality of strip-shaped polarizing portions and the plurality of strip-shaped transparent portions are alternately arranged; the parallax barrier further comprises a transparent substrate, wherein the strip-shaped polarizing portions are disposed on the transparent substrate at intervals and portions of the transparent substrate between every two adjacent strip-shaped polarizing portions are the strip-shaped transparent portions, and wherein
   a polarization direction of the strip-shaped polarizing portions of the parallax barrier and a polarization direction of the first polarizer are perpendicular to each other or have opposite rotation directions, and
   a polarization direction of the second polarizer and the polarizationdirection of the first polarizer are perpendicular to each other.

2. The display device according to claim 1, wherein the strip-shaped polarizing portions are linear polarizing portions, the first polarizer is a linear polarizer, and a transmission axis direction of the strip-shaped polarizing portions is perpendicular to a transmission axis direction of the first polarizer.

3. The display device according to claim 1, wherein the strip-shaped polarizing portions are circular polarizing portions, the first polarizer is a circular polarizer, and a rotation direction of the polarization direction of the strip-shaped polarizing portions are opposite to a rotation direction of the polarization direction of the first polarizer.

4. The display device according to claim 1, wherein the display panel comprises a plurality of pixel units, and the parallax barrier is configured to transmit light emitted by the pixel units for a left-eye image to a left eye of a user and transmit light emitted by the pixel units for a right-eye image to a right eye of the user.

5. A manufacturing method of a display device, the display device comprising a display panel, a parallax barrier and a backlight module, wherein
   the display panel is a liquid crystal display (LCD) panel, the backlight module is located at a light incident side of the LCD panel, and the parallax barrier is located between the LCD panel and the backlight module,
   the LCD panel comprises a first polarizer located at a side of the LCD panel close to the parallax barrier and a second polarizer located at a side of the LCD panel away from the parallax barrier, the first polarizer and the second polarizer are located at two sides of the LCD panel, respectively, and both are located at a side of the parallax barrier away from the backlight module, and
   the parallax barrier comprises: a plurality of strip-shaped polarizing portions and a plurality of strip-shaped transparent portions, the plurality of strip-shaped polarizing portions and the plurality of strip-shaped transparent portions extend in a same direction, and the plurality of strip-shaped polarizing portions and the purality of strip-shaped transparent portions are aternately arranged; the parallax barrier further comprises, a transparent substrate, wherein the strip-shaped polarizing portions are disposed on the transparent substrate intervals and portions of the transparent substrate between every two adjacent strip-shaped polarizing portions are the strip-shaped transparent portions, and wherein
   a polarization direction of the strip-shaped polarizing portions of the parallax barrier and a polarization direction of the first polarizer are perpendicular to each other or have opposite rotation directions, and
   a polarization direction of the second polarizer and the polarization direction of the first polarizer are perpendicular to each other,
   the manufacturing method comprising:
   applying liquid photo-curable adhesive on a display panel;

attaching the parallax barrier to the liquid photo-curable adhesive; and irradiating the parallax barrier with curing light to cure the liquid photo-curable adhesive, wherein the manufacturing method further comprises:

applying a liquid UV curable adhesive on the first polarizer, attaching the parallax barrier to the liquid UV curable adhesive; and irradiating the parallax barrier with UV curing light having a polarization direction the same as the strip-shaped polarizing portions of the parallax barrier, to cure the liquid UV curable adhesive.

6. The display device according to claim 1; wherein the strip-shaped polarizing portions and the strip-shaped transparent portions are at an angle of 10°~15° with respect to a direction perpendicular to a connection line of human eyes under a normal viewing state.

7. The display device according to claim 1, wherein the strip-shaped polarizing portions and the strip-shaped transparent portions are provided in a same layer.

* * * * *

UNITED STATES PATENT AND TRADEMARK OFFICE
CERTIFICATE OF CORRECTION

PATENT NO. : 10,652,524 B2  
APPLICATION NO. : 15/742714  
DATED : May 12, 2020  
INVENTOR(S) : Naifu Wu and Wei Wei Page 1 of 1

It is certified that error appears in the above-identified patent and that said Letters Patent is hereby corrected as shown below:

On the Title Page

Item (30), should read:  
-- (30) Foreign Application Priority Data  
August 30, 2016 (CN) ........................... 201610772820.1 --

Signed and Sealed this  
Sixteenth Day of February, 2021

Drew Hirshfeld  
*Performing the Functions and Duties of the*  
*Under Secretary of Commerce for Intellectual Property and*  
*Director of the United States Patent and Trademark Office*